United States Patent [19]

Shin et al.

[11] Patent Number: 5,149,664
[45] Date of Patent: Sep. 22, 1992

[54] SELF-ALIGNING ION-IMPLANTATION METHOD FOR SEMICONDUCTOR DEVICE HAVING MULTI-GATE TYPE MOS TRANSISTOR STRUCTURE

[75] Inventors: Yun-seung Shin; Soo-Cheol Lee, both of Seoul, Rep. of Korea

[73] Assignee: Samsung Eectronics Co., Ltd., Kyunggi, Rep. of Korea

[21] Appl. No.: 408,649

[22] Filed: Sep. 18, 1989

[51] Int. Cl.$^5$ .................... H01L 21/265; H01L 21/28
[52] U.S. Cl. .................................. 437/41; 437/45; 437/49; 437/57; 437/984
[58] Field of Search ................ 437/34, 41, 43, 45, 437/48, 49, 56, 57, 984

[56] References Cited

U.S. PATENT DOCUMENTS

| | | | |
|---|---|---|---|
| 4,364,167 | 12/1982 | Doncey | 437/48 |
| 4,397,077 | 8/1983 | Derbenwick et al. | 437/48 |
| 4,818,716 | 4/1989 | Okuyama et al. | 437/48 |
| 4,898,840 | 2/1990 | Okuyama | 437/48 |
| 4,904,615 | 2/1990 | Okuyama et al. | 437/48 |

FOREIGN PATENT DOCUMENTS 60-229365 11/1985 Japan ..................... 437/48

Primary Examiner—Olik Chaudhuri
Assistant Examiner—G. Fourson
Attorney, Agent, or Firm—Cushman, Darby & Cushman

[57] ABSTRACT

A self-aligning ion-implantation method for forming multi-gate MOS transistor structures within a semiconductor cell array on a substrate is provided. Each structure includes a plurality of first gate electrode layers and a plurality of second gate electrode layers arranged in an alternating sequence over a channel region between a drain and a source region and insulated from each other. The method includes a step for forming the first gate electrode layers at uniform spaced intervals in that channel region; a step for ion implanting an impurity into a first predetermined channel region located below the space between two of said first gate electrode layers; a step for forming a second gate electrode layer in each space between two first gate electrode layers such that each second gate electrode layer overlaps a portion of the top surface of the two first gate electrode layers adjacent to it; and a step for forming a mask over two of said second gate electrode layers and ion implanting an impurity into a second predetermined channel region below a first gate electrode layer between the two second gate electrode layers, using the mask. The ion implantation is self-aligned due to the positioning of adjacent gate electrode layers.

17 Claims, 5 Drawing Sheets

SELF-ALIGNING ION-IMPLANTATION METHOD FOR SEMICONDUCTOR DEVICE HAVING MULTI-GATE TYPE MOS TRANSISTOR STRUCTURE

FIELD OF THE INVENTION

The present invention relates to a manufacturing method for semiconductor devices, and particularly to a new self-aligning ion implantation method in which the problem of mis-alignment is solved in the manufacturing of a multi-gate mask ROM (MUGROM).

BACKGROUND OF THE INVENTION

Recently, with the progress of semiconductor manufacturing techniques and with the expansion of the application of semiconductor memory devices of large capacities are developed and promoted. Particularly, large capacity ROMs which are simple in structure and which do not require fastidious manufacturing processes are being rapidly developed.

To increase memory cell density, various manufacturing methods for mask ROM such as contact mask method, diffused layer mask method, NAND type ion-implantation method, and multi-gate method have been proposed and put to practical uses, the methods being selectively adopted depending on the memory cell structure.

The multi-gate type ROM (hereinafter "MUGROM") has a multi-gate MOS transistor structure which is similar to the structure of the charge coupled device (CCD), and consists of memory cell arrays. (Refer to "4 mega bit full wafer ROM," 1980 IEEE international solid state circuit conference, pp 150-151).

FIG. 1 illustrates a plan view of a MUGROM cell array structure, and FIG. 2 illustrates a transistor equivalent circuit for the MUGROM cell array of FIG. 1. A MUGROM cell array has a plurality of gate electrodes which are formed by a double polycrystalline silicon gate process on the channel region located between a drain region 1 and a source region 2. A bit line B is connected through a metallic contact hole 3 to drain region 1. The source region 2 serves as a common source line CS; the gate electrodes serve as word lines W. FIG. 3 is a cross-sectional view taken along the line A—A of FIG. 1. The areas C drawn in oblique lines in FIG. 1 indicate the channel regions where an impurity of an opposite type to that of the substrate is doped. That is, if the substrate is doped with a P type impurity, the channel regions are doped with an N type impurity. Accordingly, the ion-implanted regions will constitute channel depletion type transistors (M1, M3, and M6 in FIG. 2), while the remaining regions constitute channel enhancement type transistors (M2, M4 and M5 in FIG. 2).

The channel depletion type transistors and channel enhancement type transistors have different gate threshold voltages respectively represented by information level "1" and "0". The manufacturing process for such a MUGROM will be described referring to FIG. 4.

FIG. 4a illustrates a doping process in which first a field oxide layer is grown to define an active region, and an N type impurity such as arsenic is ion-implanted into a predetermined first channel region 20a. The ion-implantation is by applying a first cell ion-implanting mask 11 on a P type silicon substrate. The substrate is one which has undergone a P type impurity-doping process for adjusting the threshold voltage on the active region.

FIG. 4b illustrates an ion implanting process in which first a first gate oxide film 12 is grown and a first polycrystalline silicon layer is deposited after the completion of the first cell ion implanting process. Then, first gate electrodes 13 are formed through an etching process for the first polycrystalline silicon layer by applying a first gate mask. Then, an N type impurity is ion-implanted into a predetermined second channel region 20b by applying a second cell ion implanting mask 14.

FIG. 4c illustrates a process in which the photoresist, i.e., the second cell ion implanting mask 14 is removed after the completion of the second cell ion implanting process. Then, a second gate oxide film 15 is grown on it, and then a second polycrystalline silicon layer is deposited on it. Then, second gate electrodes 16 are formed through an etching process directed to the second polycrystalline silicon layer by applying a second gate mask.

FIG. 4d illustrates a state after the completion of a process in which first and second insulating layers 17, 18 are successively formed on the above mentioned first and second gate electrodes 13, 16, and after a metallization process is carried out.

In the above described conventional MUGROM manufacturing method, the first polycrystalline silicon gate electrode layer 13c is liable to be mis-aligned on the first cell ion-implanted region 20a, because the first polycrystalline silicon gate electrode layer 13c is formed after the completion of the first cell ion-implanting process.

Accordingly, due to the mis-alignment problem, the cell ion-implanting mask has to be made larger than that which is necessary for the actual cell channel region. That constitutes a limitation in an effort to reduce the length of the channel. Moreover, where the mis-alignment problem is severe, the bit line is rendered inoperational, resulting in a lower production yield.

Also, as the density of cells increase, the area of cells diminish; the tolerance for mis-alignment is proportional to the area of cells. When cell areas have to be made larger than that otherwise necessarily required, as described above, a limitation is imposed on the increases in cell density, and large capacity ROMs cannot be achieved.

SUMMARY OF THE INVENTION

It is an object of the present invention to provide a self-aligning ion-implantation method for semiconductor devices having multi-gate type MOS transistors, which would not cause mis-alignment between the cell ion-implanted regions and the gate electrode layers.

It is another object of the present invention to provide a self-aligning ion-implantation method in which the density of MUGROM is improved, and in which the production yield is increased.

The present invention uses a semiconductor device having a multi-gate type MOS transistor structure with a plurality of first gate electrode layers and a plurality of second gate electrode layers. The first and second electrode layers are alternatingly arranged and electrically insulated from each other on a channel region between a drain region and a source region of the semiconductor device. Thus, the sequence of gate electrode layers alternates on each increment between a first gate electrode layer and a second gate electrode layer.

The second gate electrode layers each has peripheral areas which overlap portions of the top surface of portions of the adjacent first gate electrode layers. A first predetermined channel region is defined in relation to a first gate electrode layer and is located in an area thereunder; a second predetermined channel region is defined in relation to a second gate electrode layer and is located in an area thereunder; another channel region is located between the two predetermined channel regions. Either said another channel region, or at least one of said predetermined channel regions, is ion implanted with an impurity in a step using a mask defined by the two gate electrode layers adjacent the gate electrode layer above that channel region. Accordingly, the ion implantation is accomplished in a self-aligned manner, resulting in the elimination of the mis-alignment problem of the prior art.

In one embodiment, first gate electrode layers are first formed, and then an impurity is ion-implanted into the first predetermined channel region located below the area between two first gate electrode layers in a self-aligned manner due to the positioning of the two adjacent first gate electrode layers. Thereafter, second gate electrode layers are formed between the first gate electrode layers such that a peripheral region of each second gate electrode layer overlaps portions of the top surface of the two adjacent first gate electrode layers. Then an impurity is ion-implanted into the second predetermined channel region located below a first gate electrode layer in a self-aligned manner due to the positioning of the two adjacent second gate electrode layers.

In another embodiment, a channel region is first formed by ion implantation into the substrate. First gate electrode layers are then formed. Thereafter, second gate electrode layers are formed between the first gate electrode layers such that a peripheral region of each second gate electrode layer overlaps portions of the top surface of the two adjacent first gate electrode layers. Then an impurity of a different conduction type as that first ion implanted into the substrate is ion-implanted into the channel region located between a first predetermined channel region under a second gate electrode layer and a second predetermined channel region under a first gate electrode layer.

BRIEF DESCRIPTION OF THE DRAWINGS

The above objects and other advantages of the present invention will become more apparent by describing the preferred embodiment of the present invention with reference to the attached drawing in which.

DETAILED DESCRIPTION

Figure 2:
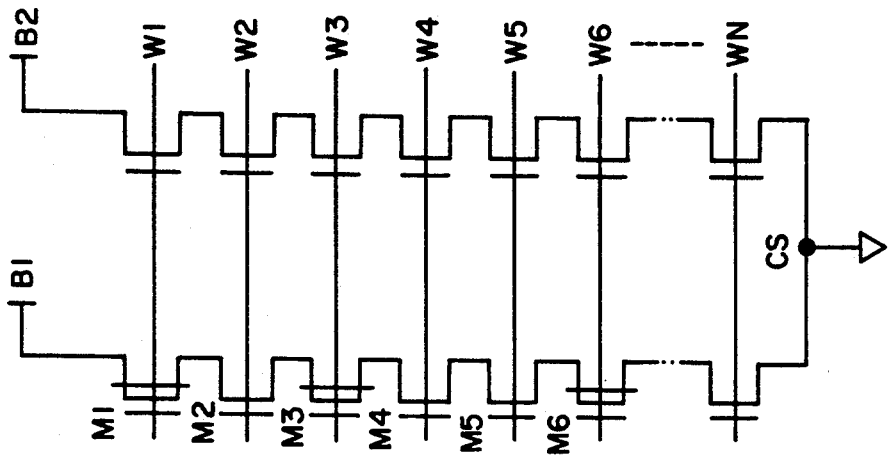
FIG. 2 is an equivalent circuit of the transistors of the MUGROM cell array of FIG. 1.
Figure 1:
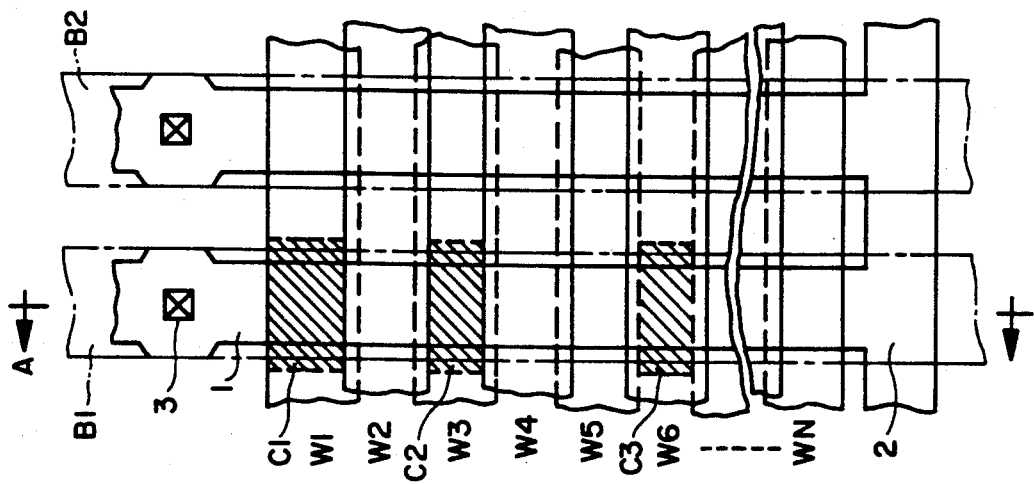
FIG. 1 is a plan view showing the cell array structure of a MUGROM in the prior art.
Figure 3:
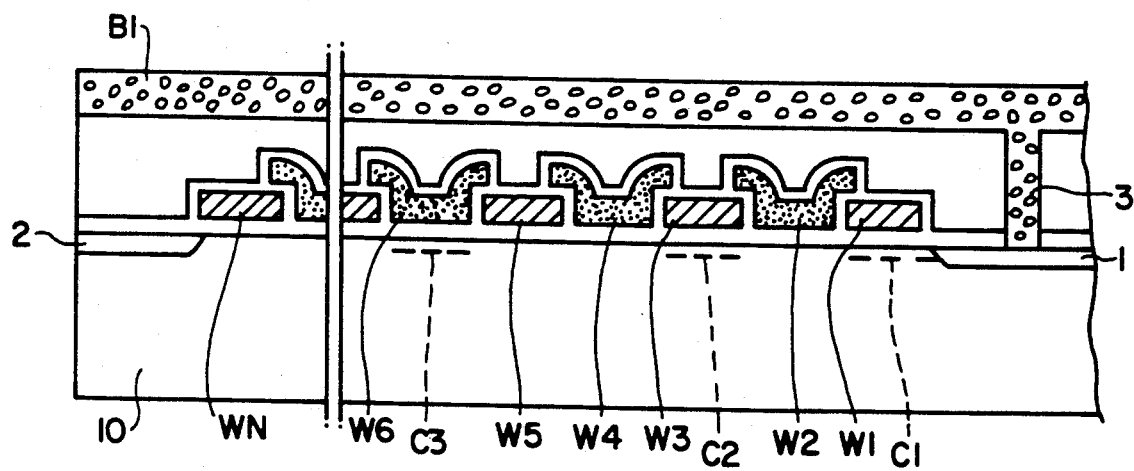
FIG. 3 is a cross-sectional view taken along the line A—A of FIG. 1 showing the cell array structure of the MUGROM.
Figure 4A:
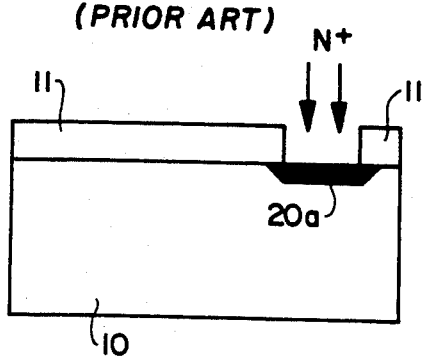
FIGS. 4A–4D illustrate the cell ion-implanting process for the MUGROM according tot he conventional technique.
Figure 4C:
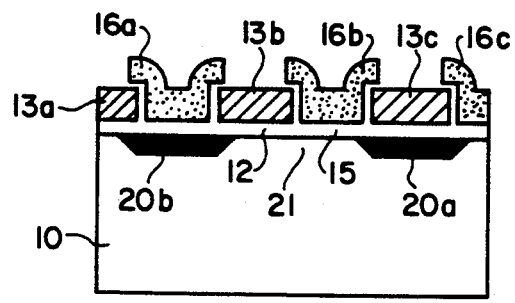
Figure 4B:
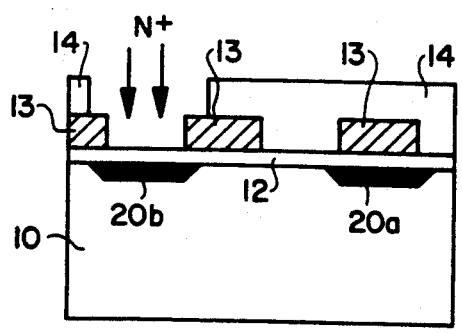
Figure 4D:
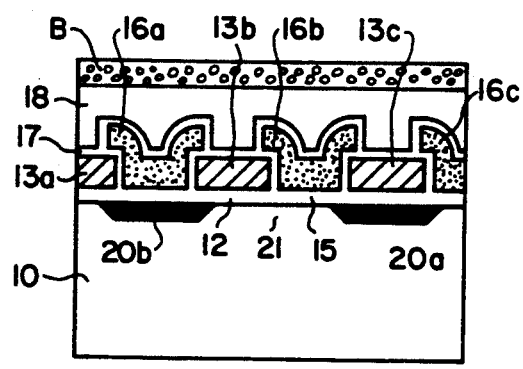
Figure 5A:
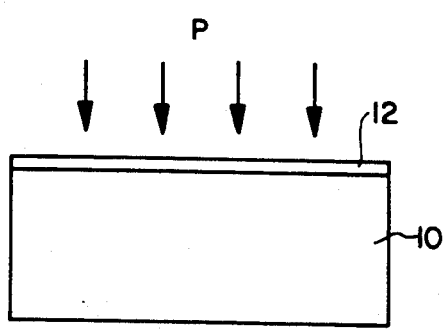
FIGS. 5A–5D illustrate the cell ion-implanting process for the MUGROM according to an embodiment of the present invention.

In the process of FIG. 5a, an impurity is doped into cell-separating regions of a P type silicon substrate 10 in order to adjust the field threshold voltage, and then, field oxide layers are thermally grown to define active regions. Thereafter, a first gate oxide film 12 is grown, and, before or after the growing of the first gate oxide film 12, the process of doping a P type impurity is carried out in order to adjust the threshold voltage of the active regions to 0.7 V.

Figure 5B:
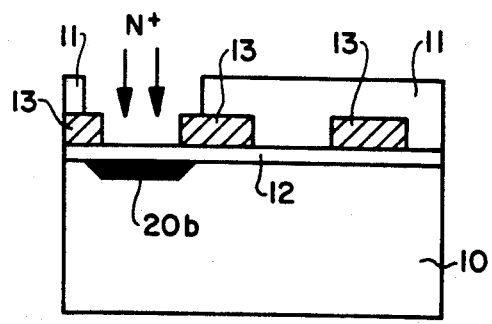

In the process of FIG. 5b, a first polycrystalline silicon layer is deposited after the completion of the above mentioned process, and first gate electrode layers 13 are formed by etching the first polycrystalline silicon layer through the application of a first gate mask. Thereafter, an N type impurity is ion-implanted into a predetermined channel region 20b by applying a first cell ion-implanting mask 11.

Figure 5C:
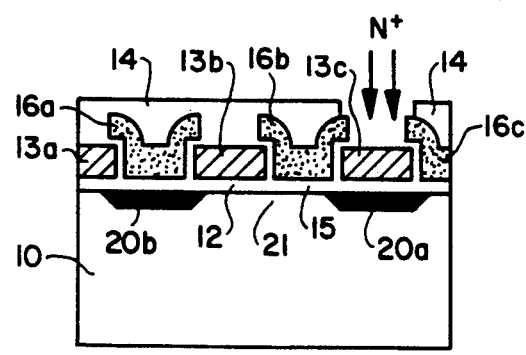

In the process of FIG. 5c, the first cell ion-implanting mask 11 is removed, then a second gate oxide film 15 is grown, and then, a second polycrystalline silicon layer is deposited. Then second gate electrode layers 16 are formed by etching the second polycrystalline silicon layer through the application of a second gate mask.

The second gate electrode layers 16 are formed between the first gate electrode layers 13. Moreover, peripheral portions of each second electrode layers 16 overlap with portions of the top surface of adjacent first electrode layers 13 such that the former covers the latter.

The second gate electrode layer 16a is formed in a manner self-aligned with the N type impurity ion-implanted region 20b due to the adjacent first gate electrode layers 13a, 13b. Thereafter, an N type impurity is ion-implanted through a first gate electrode layer 13c into a predetermined channel region 20a located below the first gate electrode layer 13c by applying a second cell ion-implanting mask 14. This N type impurity ion-implanted region 20a is self aligned with the first gate electrode layer 13c due to second gate electrode layers 16b, 16c located adjacently to the first gate electrode layer 13c.

Figure 5D:
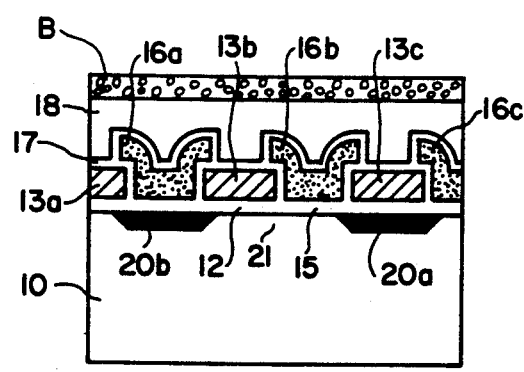

In the process of FIG. 5d, after the completion of the ion-implanting processes in a self-aligned manner as described above, a first intermediate insulating layer 17 and second intermediate insulating layer 18 are deposited, and then, a metallization process is carried out. As shown in FIGS. 5c and 5d, the predetermined regions 20a and 20b of the each channel are of the channel depletion type, whereas other regions of each channel are of the channel enhancement type.

FIGS. 6a to 6d illustrate the sequence of the cell ion-implanting processes for the MUGROM according to another embodiment of the present invention.

Figure 6A:
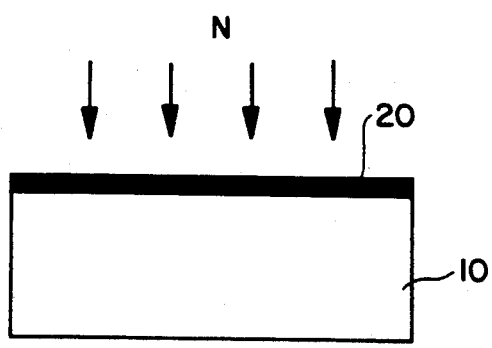
FIGS. 6A–6D illustrate the cell ion-implanting processes for the MUGROM according to another embodiment of the present invention.

In the process of FIG. 6a, an N type impurity is ion-implanted into the whole region of a channel region 20 to form a depletion type channel (with the threshold voltage being negative). The ion implantation is after the completion of the defining of the active region by thermally growing a field oxide layer upon doping of an impurity in order to adjust the field threshold voltage in the cell separating regions of the P type silicon substrate 10.

Figure 6C:
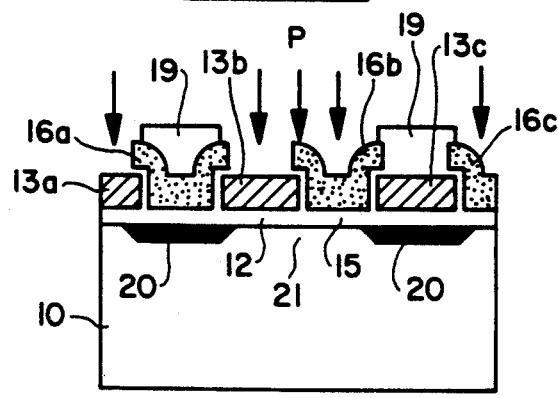
Figure 6B:
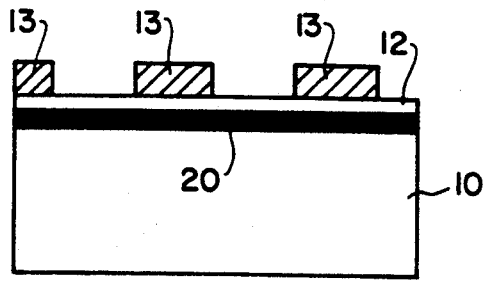

In the process of FIG. 6b, after the completion of the above described process, a first gate oxide film 12 is grown, then a first polycrystalline silicon layer is deposited, and then, first gate electrode layers 13 are formed by etching selectively the first polycrystalline silicon layer through the application of a first gate mask.

In the process of FIG. 6c, after the completion of the above described process, a second gate oxide film 15 is grown, and a second polycrystalline silicon layer is deposited. Then, the second polycrystalline silicon layer is selectively etched by applying a second gate mask to form second gate electrode layer 16. Thereafter, through the use of a cell ion-implanting mask 19, a P type impurity is ion-implanted through the gate electrode layers into the predetermined channel regions located below gate electrode layers 13a, 13b, 16b, 16c but excluding the regions below gate electrode layers 13c, 16a. Accordingly, the channel region 21 which is doped with a P type impurity will be altered from a channel depletion type to a channel enhancement type, while only the predetermined channel regions 20 which are located under the gate electrode layers 13c, 16a will remain as channel depletion regions. Therefore, the gate electrode layers 13c, 16a and the channel regions 20 are self aligned to corresponding channel regions.

Figure 6D:
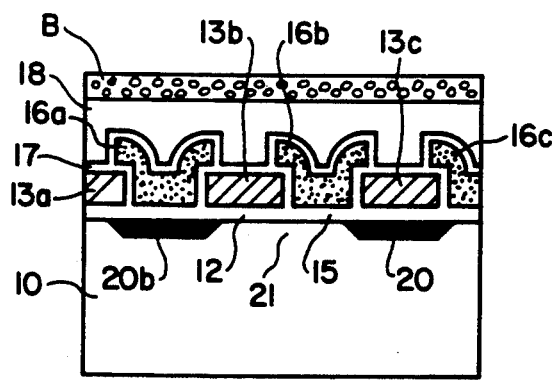

In the process of FIG. 6d, after the completion of the self-aligned ion-implantation as described above, a first intermediate insulating layer 17 and a second intermediate insulating layer 18 are deposited, and a metallization process is carried out.

According to the method of the present invention as described above, the gate electrode layers are made to serve as the self-aligning mask during cell ion-implantation. The mis-alignment problem between the gate electrode layers and the ion-implanted regions can be prevented. Consequently, memory cell density can be increased because there would be no need to make the cell size larger than what is otherwise necessary in order to compensate for the mis-alignment problem.

In the embodiments of the present invention, polycrystalline silicon was used as the material of the gate electrode layers, but other materials having a conductivity same as or larger than that of the polycrystalline silicon can be used. For instance, silicides of high melting point metals or a group of high melting point metals are suitable. Further, the method of the present invention is not limited to the manufacturing of MUGROM, but can be extended to the manufacturing of all kinds of semiconductor devices having a multi-gate type MOS transistor structure and capable of selectively adjusting the threshold voltage of the gates.

What is claimed is:

1. A self-aligning ion-implantation method for semiconductor devices comprising a plurality of first gate electrode layers and a plurality of second gate electrode layers arranged alternately and mutually insulatedly on channel regions located between drain regions and source regions of a semiconductor substrate so that said layers constitute a multigate type MOS transistor structure, comprising the steps of:

forming said first gate electrode layers at uniform intervals on said channel regions in such a manner as to be electrically insulated from said substrate;

ion-implanting an impurity having a conduction type different from that of said substrate into selected ones of said channel regions located between said first gate electrode layers;

forming said second gate electrode layers on said channel regions located between said first gate electrode layers in such a manner as to be electrically insulated from said substrate and said first gate electrode layers, and in such a manner as for the peripheral portions of said second gate electrode layers to be overlapped with the peripheral portions of said first gate electrode layers, at least one of said second gate electrode layers being disposed above said selected channel regions doped with the impurity; and ion-implanting an impurity having a conduction type different from that of said substrate through said first gate electrode layers into selected others of said channel regions located below said first gate electrode layers, whereby the impurity is ion-implanted in a self-aligned manner due to adjacent ones of said second gate electrode layers.

2. The self-aligning ion-implantation method for semiconductor devices as claimed in claim 1, wherein, prior to forming said first gate electrode layers, an impurity of the same type as that of said substrate is ion-implanted into an active region of said substrate, above which said first and second gate electrode layers are formed, to adjust the gate threshold voltage.

3. The self-aligning ion-implantation method for semiconductor devices as claimed in claim 2, wherein said selected channel regions constitute a channel of a depletion mode transistor, and the remaining channel regions constitute a channel of an enhancement mode transistor.

4. The self-aligning ion-implantation method for semiconductor devices as claimed in claim 3, wherein said substrate is P type, and the impurity ion-implanted into said channel regions is N type.

5. The self aligning ion-implantation method for semiconductor devices as claimed in claim 3, wherein said substrate is N type, and the impurity ion-implanted into said channel regions is P type.

6. The self-aligning ion-implantation method for semiconductor devices as claimed in any one of claims 1, 2, 3, 4, and 5, wherein said first and second gate electrode layers are made of polycrystalline silicon.

7. The self-aligning ion-implantation method for semiconductor devices as claimed in any one of claims 1, 2, 3, 4, and 5, wherein said first and second gate electrode layers are made of a material having a conductivity not less than that of polycrystalline silicon.

8. A method for forming multi-gate MOS transistor structures within a semiconductor cell array on a substrate, each said structure including a plurality of first gate electrode layers and a plurality of second gate electrode layers arranged in an alternating sequence over a channel region between a drain and a source region and insulated from each other, comprising the steps of:

forming said first gate electrode layers in spaced intervals on said channel region;

ion-implanting an impurity into a first channel region located below the space between two of said first gate electrode layers;

forming a second gate electrode layer in each space between two first gate electrode layers; each said second gate electrode layer overlaps a portion of the top surface of the two adjacent first gate electrode layers;

conducting one of the following two steps, (1) forming a mask over two of said second gate electrode layers, and ion-implanting an impurity into a second channel region located below a first gate electrode layer between said two second gate electrode layers, using said mask, said ion implantation being through said first gate electrode layer above said second channel region;

(2) ion-implanting an impurity into a second channel region located below one of said first gate electrode layers; forming a mask over said second gate electrode layer above said first channel region and said first gate electrode layer above said second channel region; ion-implanting a channel region between said first and second channel regions, using said mask, said ion implantation being through each gate electrode layer above said channel region between said first and second channel region;

whereby the ion-implantation in said steps (1) and (2) is self-aligned and wherein:
said first channel region is ion implanted with an impurity having a conduction type different from that of the substrate;
in said step (1) said second channel region is ion implanted with an impurity having a conduction type different from that of the substrate; and
in said step (2) said channel region between said first and second channel regions is ion implanted with an impurity having the same conduction type as that of the substrate.

9. A method as recited in claim 8, wherein:
each of said first and second channel regions forms a channel for a depletion mode transistor and said channel region between said first and second channel regions forms a channel for an enhancement mode transistor.

10. A method as recited in claim 9, wherein: said substrate is P type semiconductor and said impurity ion implanted into said first and second channel regions are both N type.

11. A method as recited in claim 9, wherein said first and second gate electrode layers are made of polycrystalline silicon.

12. A method as recited in claim 9, wherein: said step (1) is conducted, not said step (2).

13. A method as recited in claim 9, wherein: said step (2) is conducted, not said step (1).

14. A method as recited in claim 12, further comprising the step of:
prior to forming said first gate electrode layers, ion implanting an impurity of the same type as said substrate into an active region on said substrate to adjust the gate threshold voltage.

15. A method as recited in claim 14, wherein:
said substrate is P type semiconductor and said impurity ion implanted into said first and second channel regions are both N type.

16. A method as recited in claim 13, further comprising the steps of:
prior to said step (2) ion-implanting into said channel region an impurity having a different conduction type as that of the substrate.

17. A method as recited in claim 16, wherein:
the substrate is P type semiconductor; and
said impurity ion implanted into said first and second channel region and into said channel region between said first and second channel region are all of the N type.

* * * * *